(12) United States Patent
Chen

(10) Patent No.: US 9,338,835 B2
(45) Date of Patent: May 10, 2016

(54) LIQUID-COOLED LED LAMP

(71) Applicant: BEIJING UGETLIGHT CO., LTD., Beijing (CN)

(72) Inventor: Xiran Chen, Langfang (CN)

(73) Assignee: BEIJING UGETLIGHT CO., LTD., Beijing (CN)

( * ) Notice: Subject to any disclaimer, the term of this patent is extended or adjusted under 35 U.S.C. 154(b) by 0 days.

(21) Appl. No.: 14/028,532

(22) Filed: Sep. 16, 2013

(65) Prior Publication Data

US 2014/0015397 A1 Jan. 16, 2014

Related U.S. Application Data

(63) Continuation-in-part of application No. PCT/CN2011/071891, filed on Mar. 17, 2011.

(51) Int. Cl.
| | | |
|---|---|---|
| H05B 33/02 | (2006.01) |
| F21V 29/00 | (2015.01) |
| F21K 99/00 | (2016.01) |
| F21V 29/58 | (2015.01) |
| F21Y 101/02 | (2006.01) |
| F21Y 111/00 | (2016.01) |
| F21V 29/506 | (2015.01) |

(52) U.S. Cl.
CPC ............... *H05B 33/02* (2013.01); *F21K 9/135* (2013.01); *F21V 29/004* (2013.01); *F21V 29/58* (2015.01); *F21V 29/506* (2015.01); *F21Y 2101/02* (2013.01); *F21Y 2111/001* (2013.01); *F21Y 2111/007* (2013.01); *H01L 2924/0002* (2013.01)

(58) Field of Classification Search
USPC .................. 362/101, 294, 84; 313/36, 46, 512
See application file for complete search history.

(56) References Cited

U.S. PATENT DOCUMENTS

| 7,111,963 | B2 * | 9/2006 | Zhang ........................... 362/294 |
|---|---|---|---|
| 7,182,484 | B2 * | 2/2007 | Buelow et al. ................ 362/294 |
| 7,878,697 | B2 * | 2/2011 | Chiang ......................... 362/555 |
| 7,922,359 | B2 * | 4/2011 | Chiang ......................... 362/294 |
| 7,997,750 | B2 * | 8/2011 | Chiang ......................... 362/101 |
| 8,439,528 | B2 * | 5/2013 | Lenk et al. ............... 362/311.02 |
| 8,653,723 | B2 * | 2/2014 | Cao et al. ........................ 313/46 |
| 2004/0004435 | A1 * | 1/2004 | Hsu ............................... 313/512 |
| 2009/0001372 | A1 * | 1/2009 | Arik et al. ....................... 257/58 |
| 2009/0273921 | A1 * | 11/2009 | Chiang ......................... 362/101 |
| 2009/0273924 | A1 * | 11/2009 | Chiang ......................... 362/241 |
| 2010/0207502 | A1 * | 8/2010 | Cao et al. ........................ 313/46 |
| 2011/0228516 | A1 * | 9/2011 | Stewart et al. .................. 362/84 |
| 2011/0255268 | A1 * | 10/2011 | Horn et al. .................... 362/101 |
| 2012/0026723 | A1 * | 2/2012 | Wheelock et al. ............. 362/101 |
| 2012/0287608 | A1 * | 11/2012 | Horn et al. .................... 362/101 |

* cited by examiner

*Primary Examiner* — Ashok Patel

(57) ABSTRACT

A liquid-cooled LED light, including a lamp head, a lamp core, and a lamp shell. The lamp shell covers the periphery of the lamp core. The cavity of the lamp shell is filled with silicone oil for radiating heat. One end of the lamp core is immersed in the silicone oil; at the other end of the lamp core, the lamp shell is connected hermetically to the lamp head.

13 Claims, 10 Drawing Sheets

US 9,338,835 B2

LIQUID-COOLED LED LAMP

CROSS-REFERENCE TO RELATED APPLICATIONS

This application is a continuation-in-part of International Patent Application No. PCT/CN2011/071891 with an international filing date of Mar. 17, 2011, the contents of which, are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to the field of LED lighting, and more particularly to a liquid-cooled LED illuminating lamp.

2. Description of the Related Art

LED, called the fourth-generation lighting source or green lighting source, with characteristics of energy saving, environmental protection, long life, and small size, is widely applied in various fields such as indicating, display, decorating, backlight source, general lighting and urban night-landscaping and etc.

LED light-emitting chips emit light by electronic recombination. In the case of small current, it produces little heat, but in a high-power LED illuminating lamp, especially in the field of lighting applications, great current is required, thus a lot of heat is generated and the operating temperatures are high. The main factor affecting the LED light-emitting chip is the temperature (the operating temperature of PN node), and the operating temperature of PN node is generally no higher than 120 degrees, preferably at about 100 degrees. When the temperature of PN node rises by every 10 degrees, the luminous flux decreases by 1%, the main light-emitting wavelength drifts by 1 nm, and the life is shortened accordingly. Therefore, heat dissipation of the LED is a problem that must be considered.

In addition, the volume of LED light-emitting chips is very small, and it is the point light-emitting, with high directivity (the light of LED light-emitting chip emitted is linear, the divergence is not good), which generally leads to a relatively small irradiation angle. To solve the problems of the relatively small irradiation angle, the lamp tube-type LED lighting is used, which has dense lamp array, high design costs, and poor cooling and energy-saving effect.

SUMMARY OF THE INVENTION

In view of the above-described problems, it is one objective of the invention to provide a liquid-cooled LED illuminating lamp that features good heat dissipation performance and simple structure.

To achieve the above objectives, in accordance with one embodiment of the invention, provided is a liquid-cooled LED illuminating light, comprising a lamp head, a lamp core, and a lamp shell. The illuminating shell covers the periphery of the lamp core. A cavity of the lamp shell is filled with silicone oil for radiating heat. One end of the lamp core is immersed in the silicone oil; at the other end of the lamp core, the lamp shell is connected hermetically to the lamp head.

In a class of this embodiment, a viscosity coefficient of the silicone oil is between 5 and $800 \times 10^2$ Pa·s.

In a class of this embodiment, a viscosity coefficient of the silicone oil is between 5 and $5000 \times 10^{-2}$ Pa·s.

In a class of this embodiment, the silicone oil is selected from the group consisting of methyl silicone oil, ethyl silicone oil, phenyl silicone oil, methyl hydrogen-containing silicone oil, methyl-phenyl silicone oil, methyl chlorophenyl silicone oil, methyl ethoxyl silicone oil, methyl trifluoropropyl silicone oil, methyl vinyl silicone oil, methyl hydroxy silicone oil, ethyl hydrogen-containing silicone oil, hydroxyl hydrogen-containing silicone oil and cyanide-containing silicone oil.

Advantages of the invention are summarized below: the liquid-cooled LED illuminating lamp has: 1) simple structure, and convenient manufacturing; 2) good thermal performance, and energy-saving.

Figure 1:
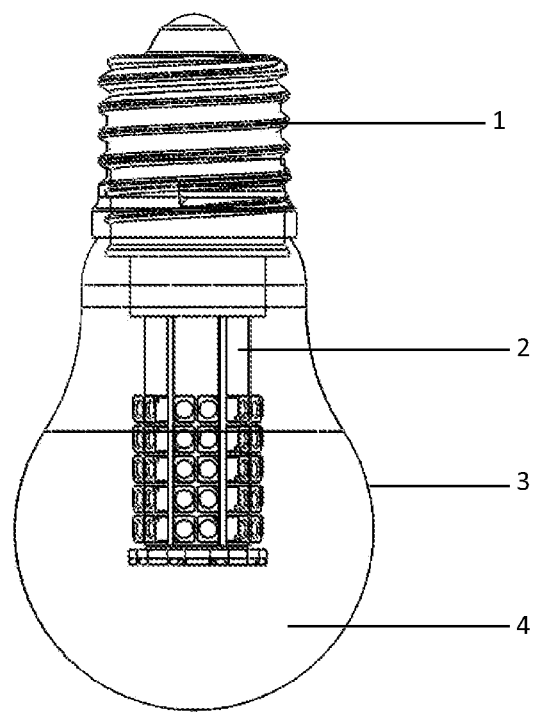
FIG. 1 is a schematic diagram of a liquid-cooled LED illuminating lamp in accordance with one embodiment of the invention.

In the drawings, the following reference numbers are used: 1. lamp head; 2. lamp core; 21. multi-row lamppost; 22. connecting piece; 6. large-angle LED light source; 61. conductive frame; 611. support body; 6111. support pillar; 6112. straight prism-shaped head; 612. support base; 6121. straight prism-shaped mounting post; 61221. mounting groove; 6122. positioning rod; 6123. threaded pillar; 6124. cylindrical hollow passage; 62. lens; 63. bonding wire; 7. metal tube; 8. lamp core pillar; 3. lamp shell; 4. silicone oil; 5. receiver of drive power.

DETAILED DESCRIPTION OF THE EMBODIMENTS

For further illustrating the invention, experiments detailing a liquid-cooled LED illuminating lamp are described below. It should be noted that the following examples are intended to describe and not to limit the invention.

Example 1

As shown in FIG. 1, a liquid-cooled LED illuminating lamp comprises a lamp head 1, a lamp core 2, and a lamp shell 3 comprising a cavity. The lamp shell 3 covers the periphery of the lamp core 2 and the cavity of the lamp shell 3 is filled with silicone oil 4 for radiating heat. One end of the lamp core 2 is immersed in the silicone oil 4 for radiating heat. At the other end of the lamp core 2, the lamp shell 3 is connected hermetically to the lamp head 1.

Preferably, the viscosity coefficient of the silicone oil is between 5 and $800 \times 10^2$ Pa·s.

Preferably, the viscosity coefficient of the silicone oil is between 5 and $5000 \times 10^{-2}$ Pa·s.

Preferably, the silicone oil is selected from the group consisting of methyl silicone oil, ethyl silicone oil, phenyl silicone oil, methyl hydrogen-containing silicone oil, methylphenyl silicone oil, methyl chlorophenyl silicone oil, methyl ethoxyl silicone oil, methyl trifluoropropyl silicone oil, methyl vinyl silicone oil, methyl hydroxy silicone oil, ethyl hydrogen-containing silicone oil, hydroxyl hydrogen-containing silicone oil, and cyanide-containing silicone oil.

Figure 2:
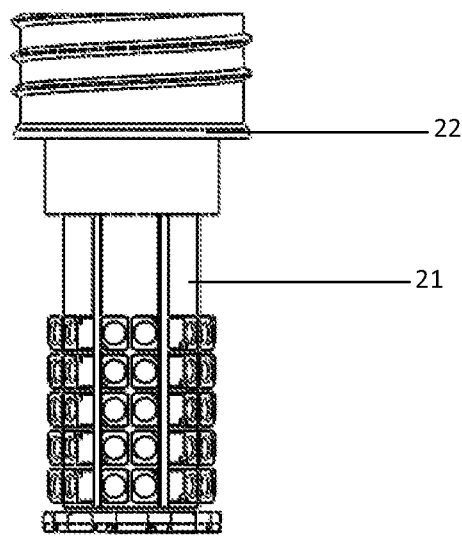
FIG. 2 is a schematic diagram of a lamp core of a liquid-cooled LED illuminating lamp in accordance with one embodiment of the invention.

Preferably, as shown in FIG. 2, the lamp core 1 comprises a multi-row lamppost 21 and a connecting piece 22. The multi-row lamppost 21 is surrounded by an aluminum-based circuit board. A plurality of LED light-emitting chips are disposed at a top surface of one end and each side face of the multi-row lamppost 21; the other end of the multi-row lamppost 21 is connected to the connecting piece 22. The connecting piece 22 is connected hermetically to the lamp head 1. The Aluminum PCB has excellent thermal conductivity, so the thermal conductivity of the multi-row lamppost is very good. The heat generated by multiple LED light-emitting chips conducts to the multi-row lamppost, as the distances between the silicone oil and the multi-row lampposts are different, whereby producing temperature difference and forming convection current. The extra heat of the multi-row lampposts is taken away by the convection current; meantime, the contact area of the lamp shell and the outside air is very big, which is beneficial to dissipate heat.

Preferably, the multi-row lamppost 21 is hollow. A plurality of holes are disposed on the each side face of the multi-row lamppost. The heat generated by multiple LED light-emitting chips conducts to the multi-row lamppost, resulting in the temperature difference of the silicone oil between the outside and the hollow part of the multi-row lamppost, and the speed of dissipating heat is accelerated by the convection of the silicone oil between the outside and the hollow part of the multi-row lamppost through the multiple holes.

Preferably, the multi-row lamppost 21 is partially or wholly immersed in the silicone oil 4.

Example 2

Figure 3:
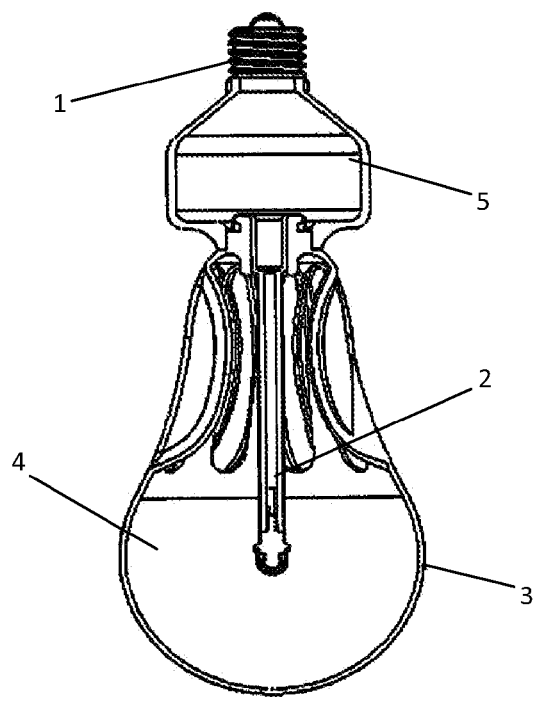
FIG. 3 is a cross-sectional view of a liquid-cooled LED illuminating lamp in accordance with one embodiment of the invention.

As shown in FIG. 3, a liquid-cooled LED illuminating lamp of the invention, comprises a lamp head 1, a lamp core 2, a lamp shell 3 comprising a cavity, silicone oil 4 for radiating heat, and a receiver 5 of a drive power. The lamp shell 3 covers the periphery of the lamp core 2 and the cavity of the lamp shell 3 is filled with the silicone oil 4 for radiating heat; and one end of the lamp core 2 is immersed in the silicone oil 4 for radiating heat; the other end of the lamp core 2 is connected hermetically to the lamp head 1 by the receiver 5. The lamp shell 3 is fixedly connected to the receiver 5.

Preferably, the viscosity coefficient of the silicone oil is between 5 and $800 \times 10^2$ Pa·s.

Preferably, the viscosity coefficient of the silicone oil is between 5 and $5000 \times 10^{-2}$ Pa·s.

Preferably, the silicone oil is selected from the group consisting of methyl silicone oil, ethyl silicone oil, phenyl silicone oil, methyl hydrogen-containing silicone oil, methyl-phenyl silicone oil, methyl chlorophenyl silicone oil, methyl ethoxyl silicone oil, methyl trifluoropropyl silicone oil, methyl vinyl silicone oil, methyl hydroxy silicone oil, ethyl hydrogen-containing silicone oil, hydroxyl hydrogen-containing silicone oil and cyanide-containing silicone oil.

Figure 4:
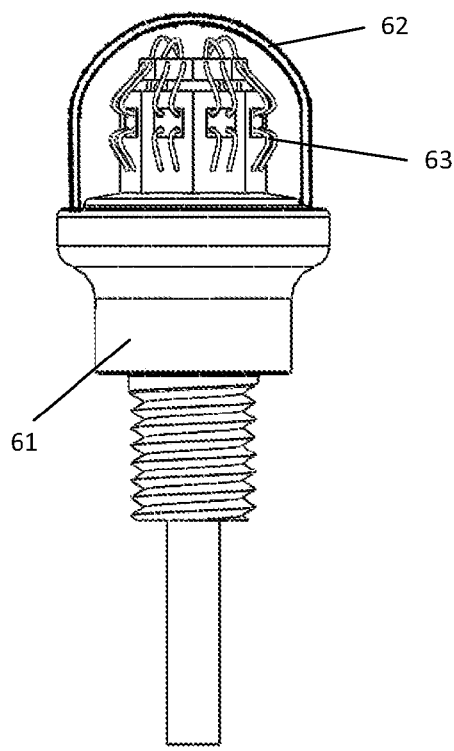
FIG. 4 is a schematic diagram of a large angle LED light source of a liquid-cooled LED illuminating lamp in accordance with one embodiment of the invention.

The lamp core 2 comprises a large-angle LED light source 6, as shown in FIG. 4, which comprises a conductive frame 61, a lens 62, a LED light emitting chip, and a bonding wire 63.

Figure 5:
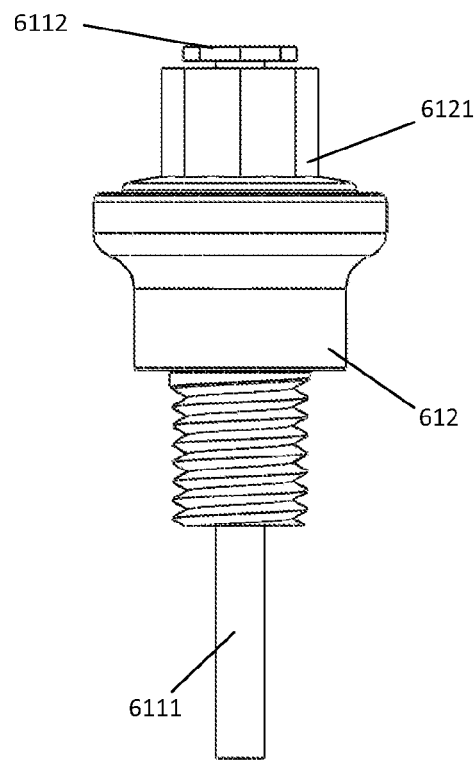
FIG. 5 is a schematic diagram of a conductive frame of a liquid-cooled LED illuminating lamp in accordance with one embodiment of the invention.
Figure 6:
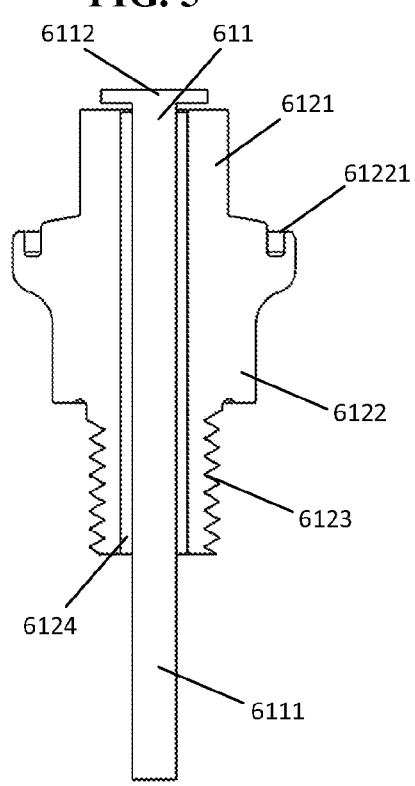
FIG. 6 is a cross-sectional view of a conductive frame of a liquid-cooled LED illuminating lamp in accordance with one embodiment of the invention.

As shown in FIG. 5 and FIG. 6, the conductive frame 61 comprises a support body 611 of a positive electrode and a support base 612 of a negative electrode. Insulating thermally conductive plastic is filled between the support body 611 and the support base 612, i.e. the support body 611 and the support base 612 are electrically conductive, and it is insulating thermally conductive between the support body 611 and the support base 612. The support body 611 is connected to the positive electrode of the circuit, and the support base 612 is connected to the negative electrode of the circuit.

The support body 611 comprises a support pillar 6111 and a straight prism-shaped head 6112 disposed on the end of the support pillar. The bottom surface of the straight prism-shaped head 6112 is a regular octagon. The radius of the straight prism-shaped head 6112 is longer than the radius of the support pillar 6111. The length of the support pillar 6111 is longer than the length of the support base 612.

From the top to the bottom of the support base 612, disposed are a straight prism-shaped mounting post 6121, a positioning pillar 6122 (its function is described below) and a threaded columns 6123 (its function is described below) in turn. The bottom surface of straight prism of the mounting post 6121 is a regular octagon. The threaded column 6123 has the shortest radius, the radius of straight prism-shaped mounting post 6121 is medium, and the radius of the positioning pillar 6122 is longest. The support base 612 comprises a cylindrical hollow passage 6124. The hollow passage 6124 is longitudinally throughout the center of the support base 612, and the radius of the hollow passage 6124 is slightly longer than the radius of the support pillar 6111, and shorter than the radius of the straight prism-shaped head 6112. The annular mounting groove 61221 is disposed on the upper surface of the positioning pillar 6122, and the lens 62 is fixed within the mounting groove 61221.

The support pillar 6111 of the support body 611 passes through the hollow passage 6124, and is embedded on an upper part of the straight prism-shaped mounting post 6121 via the straight prism-shaped head 6112. The support pillar 6111 protrudes from a lower end of the support base 612.

Figure 7:
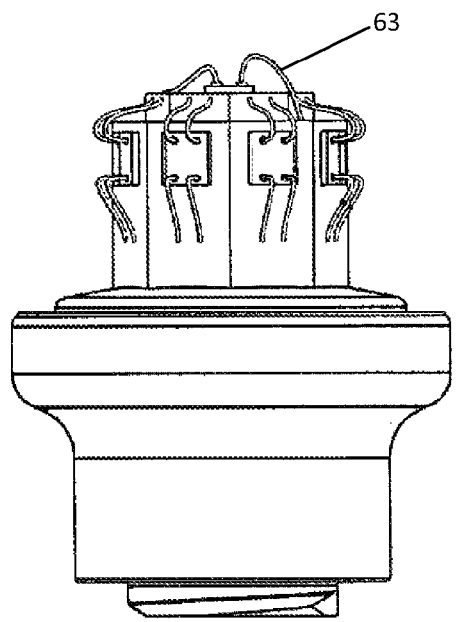
FIG. 7 is an assembly diagram of LED illuminating chips of a large-angle LED light source of a liquid-cooled LED illuminating lamp of the invention.
Figure 8:
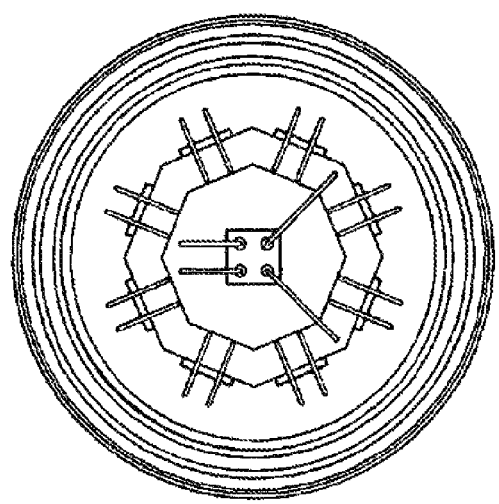
FIG. 8 is a top view of LED illuminating chips of a large-angle LED light source of a liquid-cooled LED illuminating lamp of the invention.

As shown in FIG. 7 and FIG. 8, the LED light-emitting chip is fixed on the upper surface of the straight prism-shaped head 6112 and each side face of the straight prism-shaped mounting post 6121. The positive (negative) electrode of the LED light-emitting chip is connected to the support body 611 (support base 612) via the bonding wire 63. In the case of fixing the LED light emitting chip and the using of large-angle LED light source, the positioning pillar 6122 provides an area which can be applied to torsion to facilitate the clamping and installation.

The large-angle LED light source of the example packages the spherical light emitting LED light source with the irradiation angle of greater than 270 degrees, its luminous effect approximates with conventional incandescent bulbs, and can replace the traditional incandescent lamps; but 90% energy saving than conventional incandescent lamps. Existing LED light source comprising the LED light source in which the light emitting chip is located in the polygonal surface, comprises the light emitting chip only at the side surface, thus a butterfly-shaped light spot is formed. The large-angle LED light source of the example has the LED light-emitting chips located on the upper surface of the straight prism-shaped head 6112 and the LED light-emitting chips located on polygonal surface, so that its spherical light-emitting.

Preferably, a sealant is added within the mounting groove 61221, and with the way of mechanical pressing to arrange the lens, so as to achieve the high tightness of the large-angle LED light source, greatly improving the sealing effect.

Preferably, the blue-light chips are used as LED light-emitting chips, and the fluorescent powder for exciting white light is added into the lens 62. The proportion of the fluorescent powder is no more than 10%. When the blue light passes through the lens, white light is excited. Adding the fluorescent powder into the lens 62 to excite white light reduces the step of spotting the fluorescent glue to the blue-light LED light-emitting LED chips, whereby significantly improving the production efficiency and reduce defective percentage, producing small color coordinates error of batch, and avoiding the light failure of the fluorescent powder and the drawback that the blue light of blue LED light-emitting chips cannot be effectively excited into white light.

Preferably, the support body 611 and the support base 612 are assembled by injection molding with the elements. The injection molding with the elements is a kind of plastic injection molding process, where the plastic is injected molding between two or more parts, and it is a means for processing a plurality of parts to form a whole body.

Preferably, the supporting body 611 and the support base 612 are processed by copper metal as a raw material, and their surfaces are plated with pure silver or pure gold in order to increase conductivity.

Preferably, the straight prism-shaped mounting post 6121 comprises between 3 and 10 rims.

The lamp core 2 comprises the large-angle LED light source 6, further comprises a metal tube 7 and a lamp core pillar 8. The metal tube 7 and the lamp core pillar 8 are insulated with each other. The metal tube 7 is connected to the support body 611, and the lamp core pillar 8 is connected to the support base 612.

There is thread on the inside wall of one end of the lamp core pillar 8, and there is a lamp core groove on the outer side wall of the other end of the lamp core. The metal tube 7 and the supporting pillar 6111 are connected by socketing. The lamp core pillar 8 is closely connected to the thread pillar 6123 covered by a thermally conductive sealant through the thread. The heat-conductive sealant is filled between the metal tube 7 and the lamp core pillar 8, i.e. the metal tube 7 is connected to the positive electrode of the circuit, and the lamp core pillar 8 is connected to the negative electrode of the circuit. The end of the lamp core and the mouth of the bottle of the lamp shell are compressing-sealed, thus the silicone oil 4 for radiating heat is sealed in the lamp shell 3.

The positive (negative) electrode of the lamp core is connected to the positive (negative) electrode of the drive power, and the positive (negative) electrode of the drive power is connected to the positive (negative) electrode of the lamp head 1.

Figure 9:
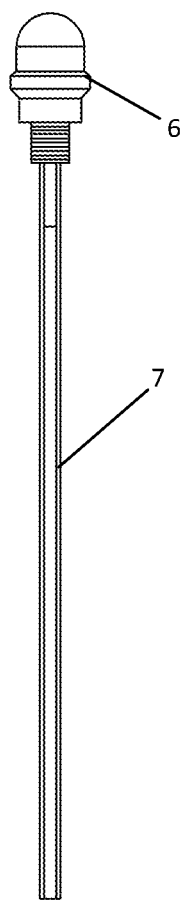
FIGS. 9-12 are assembly diagrams of a lamp core of a liquid-cooled LED illuminating lamp of the invention.
Figure 10:
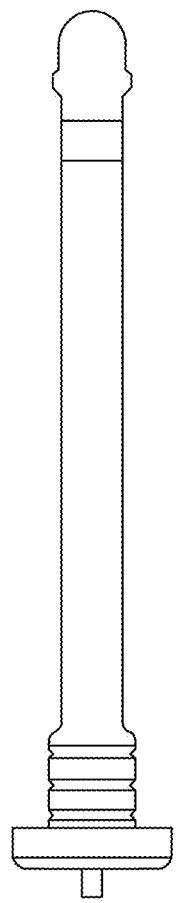
Figure 11:
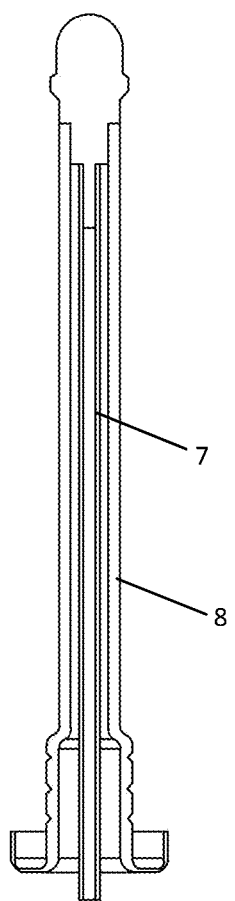

The manufacturing method of the liquid-cooled LED illuminating light is as follows:

Step 1: As shown in FIG. 9, the metal tube 7 sockets in the outer of the support pillar 6111 by the method of pressing to contract diameter; i.e. the metal tube 7 and the support body 611 combine to form a positive electrode;

Step 2: As shown in FIGS. 10 and 11, the lamp core pillar 8 is closely connected to the thread pillar 6123 covered by the thermally conductive sealant through the thread, and the heat-conductive sealant is filled between the metal tube 7 and the lamp core pillar 8, i.e. the lamp core pillar 8 and the support base 612 combine to form the negative electrode, and it is insulated and thermally conductive between the positive electrode and the negative electrode.

Figure 12:
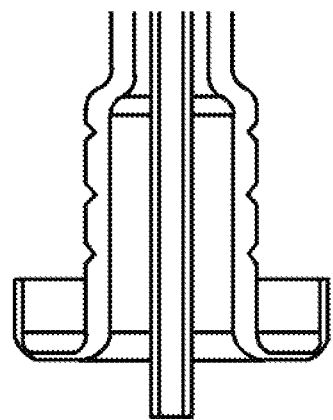
Figure 13:
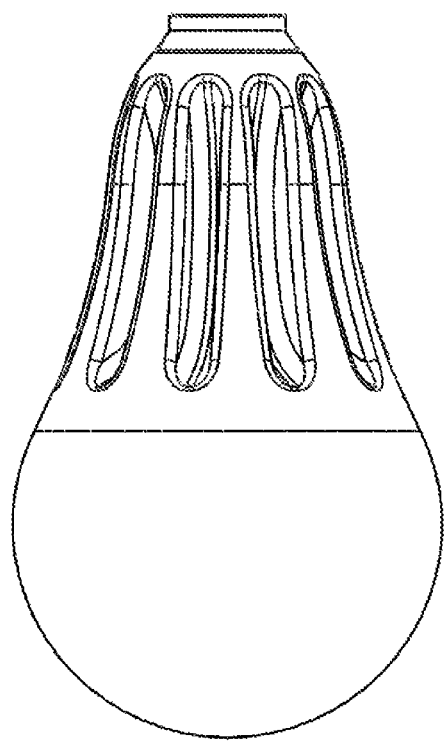
FIGS. 13-17 are assembly diagrams of a liquid-cooled LED illuminating lamp of the invention.
Figure 14:
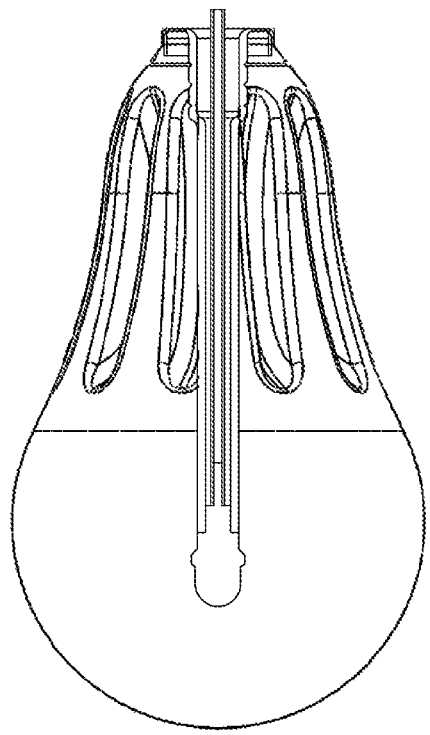
Figure 15:
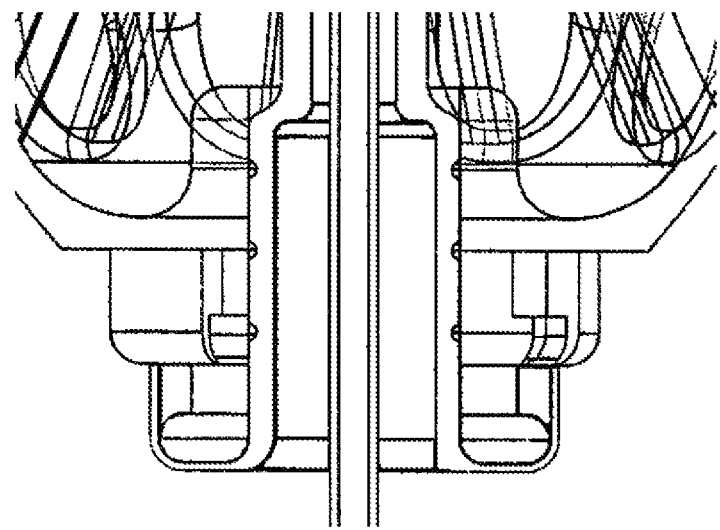
Figure 16:
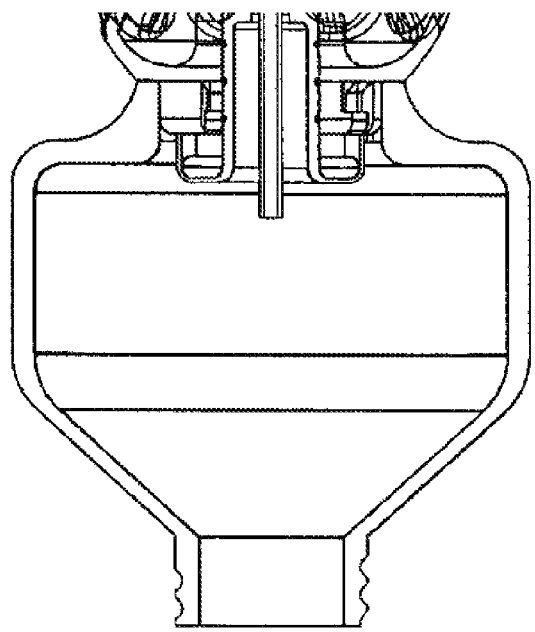
Figure 17:
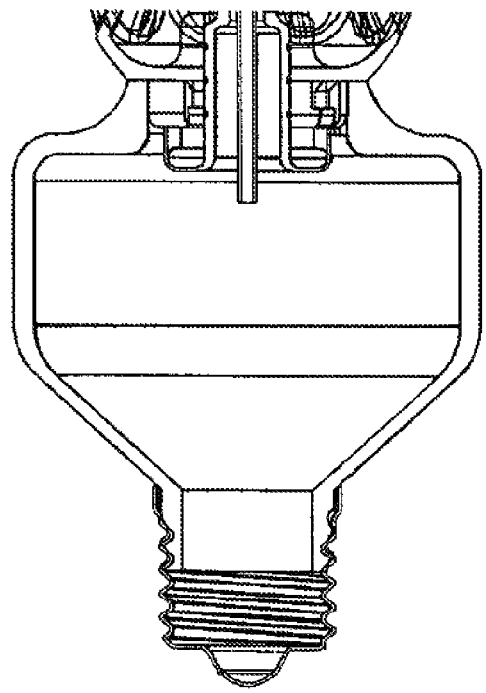

Step 3: As shown in FIG. 12, the sealant is used to cover the bottom of the groove of the lamp core 2;

Thus, the assembling of the lamp core 2 is completed;

Step 4: As shown in FIG. 13, a certain amount of high thermal conductivity of silicone oil is filled in the lamp shell 3 through the mouth of the bottle;

Step 5: As shown in FIGS. 14 and 15, the lamp core 2 is placed into the lamp shell 3, the lamp core groove and the mouth of the bottle of the illuminating shell 3 are compressing sealed by a sealer, so the silicone oil for irradiating heat is sealed in the illuminating shell 3; at this time, the large-angle LED light source is completely immersed within the high thermal conductivity of silicone oil, since the lens 62 is assembled by means of mechanical pressing, so there is no silicone oil in the large-angle LED light source;

Thus, the assembling of the lamp core 2 and the lamp shell 3 is completed;

Step 6: As shown in FIG. 16, the receiver 5 is connected to the lamp shell 3 by means of bayonet, and the positive (negative) electrode of the lamp core 2 is connected to the positive (negative) electrode of the drive power;

Step 7: As shown in FIG. 17, the receiver 5 is connected to the lamp head 1, and the positive (negative) electrode of the receiver 5 is connected to the positive (negative) electrode of the lamp head 1.

The assembling of the liquid-cooled LED illuminating light is completed.

The heat generated by the LED light-emitting chips of the liquid-cooled LED illuminating lamp is dissipate by the following ways:

For the LED light-emitting chips on each side of the straight-prism installation pillar, the heat generated is passed to the positioning pillar through the straight-prism installation pillar, and then passed to the silicone oil for irradiating heat through the positioning pillar, so as to achieve heat dissipating. For the LED light-emitting chips on the upper surface of the straight prism-shaped head position, the part of the heat generated is dissipated by the support body and the long metal tube; and part of the heat is passed to the positioning pillar through the straight-prism installation pillar, and then passed to the silicone oil for irradiating heat through the positioning pillar, so as to achieve heat dissipating.

The liquid-cooled LED illuminating lamp of the invention has the features of simple structure, convenient manufacturing, large illuminating angle, good heat-dissipating performance, and energy-saving.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A liquid-cooled LED lamp, comprising:
   a) a lamp head (1);
   b) a lamp core (2); and
   c) a lamp shell (3) comprising a cavity;
   wherein the lamp shell (3) covers a periphery of the lamp core (2);
   the cavity of the lamp shell (3) is partially filled with silicone oil (4) for radiating heat; and one end of the lamp core (2) is immersed in the silicone oil (4) for radiating heat; at the other end of the lamp core (2), the lamp shell (3) is connected hermetically to the lamp head (1);

wherein the lamp core (2) comprises a multi-row lamppost (21) and a connecting piece (22);

the multi-row lamppost (21) is surrounded by an aluminum-based circuit board;

a plurality of LED light-emitting chips is disposed at a top surface of one end and each side face of the multi-row lamppost (21); the other end of the multi-row lamppost (21) is connected to the connecting piece (22); and the connecting piece (22) is connected hermetically to the lamp head (1); and wherein the multi-row lamppost (21) is partially or wholly immersed in the silicone oil (4).

2. The lamp of claim 1, wherein a viscosity coefficient of the silicone oil is between 5 and 800×10² Pa·s.

3. The lamp of claim 1, wherein a viscosity coefficient of the silicone oil is between 5 and 5000×10⁻² Pa·s.

4. The lamp of claim 1, wherein the silicone oil is selected from the group consisting of methyl silicone oil, ethyl silicone oil, phenyl silicone oil, methyl hydrogen-containing silicone oil, methyl-phenyl silicone oil, methyl chlorophenyl silicone oil, methyl ethoxyl silicone oil, methyl trifluoropropyl silicone oil, methyl vinyl silicone oil, methyl hydroxy silicone oil, ethyl hydrogen-containing silicone oil, hydroxyl hydrogen-containing silicone oil, and cyanide-containing silicone oil.

5. The lamp of claim 1, wherein the multi-row lamppost (21) is hollow.

6. The lamp of claim 1, wherein the lamp core (2) comprises a LED light source (6); the LED light source (6) comprises a conductive frame (61), a plurality of LED light emitting chips and bonding wires (63), the LED light emitting chips are connected to the conductive frame (61) via the bonding wires (63);

the conductive frame (61) comprises a support body (611) of a positive electrode and a support base (612) of a negative electrode, the support body (611) and the support base (612) are insulated with each other;

the support body (611) comprises a straight prism-shaped head (6112), the LED light-emitting chips are fixed on an upper surface of the straight prism-shaped head (6112); and the support base (612) comprises a straight prism-shaped mounting post (6121), the LED light-emitting chips are fixed on each side face of the straight prism-shaped mounting post (6121).

7. The lamp of claim 6, wherein the LED light source (6) further comprises a lens (62), the support base (612) comprises a positioning pillar (6122), a mounting groove (61221) is disposed on an upper surface of the positioning pillar (6122), and the lens (62) is fixed on the mounting groove (61221) by means of mechanical pressing.

8. The lamp of claim 7, wherein the lens (62) comprises less than 10% of a fluorescent powder for exciting white light.

9. The lamp of claim 6, wherein the support body (611) further comprises a support pillar (6111);

the support base (612) comprises a hollow passage (6124);

the support pillar (6111) passes through the hollow passage (6124), and is embedded on an upper part of the straight prism-shaped mounting post (6121) via the straight prism-shaped head (6112); and the support pillar (6111) protrudes from a lower end of the support base (612).

10. The lamp of claim 6, further comprising a receiver (5) of a drive power, wherein one end of the lamp core (2) is connected to the lamp head (1) through the receiver (5).

11. The lamp of claim 6, wherein the lamp core (2) further comprises a metal tube (7) and a lamp core pillar (8); the metal tube (7) and the lamp core pillar (8) are insulated with each other; the metal tube (7) is connected to the support body (611), and the lamp core pillar (8) is connected to the support base (612).

12. The lamp of claim 6, wherein the support body (611) and the support base (612) are assembled by means of injection molding to achieve insulation.

13. The lamp of claim 6, wherein the straight prism-shaped mounting post (6121) comprises between 3 and 10 rims.

* * * * *